United States Patent
Zhou et al.

(10) Patent No.: US 9,803,272 B2
(45) Date of Patent: Oct. 31, 2017

(54) DEPOSITION OF SILICON DIOXIDE

(71) Applicant: SPTS TECHNOLOGIES LIMITED, Newport (GB)

(72) Inventors: Yun Zhou, Cardiff (GB); Rhonda Hyndman, Newport (GB); Stephen R Burgess, Gwent (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 0 days.

(21) Appl. No.: 14/532,098

(22) Filed: Nov. 4, 2014

(65) Prior Publication Data

US 2015/0125375 A1   May 7, 2015

(30) Foreign Application Priority Data

Nov. 7, 2013  (GB) .................................. 1319654.8

(51) Int. Cl.
*C23C 14/35* (2006.01)
*C23C 14/00* (2006.01)
*C23C 14/10* (2006.01)
*C23C 14/34* (2006.01)
*C01B 33/12* (2006.01)

(52) U.S. Cl.
CPC .......... *C23C 14/0036* (2013.01); *C01B 33/12* (2013.01); *C23C 14/10* (2013.01); *C23C 14/3485* (2013.01); *C23C 14/35* (2013.01)

(58) Field of Classification Search
CPC ..... C01B 33/12; C23C 14/0036; C23C 14/10; C23C 14/385; C23C 14/35
USPC .................................................. 204/192.23
See application file for complete search history.

(56) References Cited

U.S. PATENT DOCUMENTS

| | | | | |
|---|---|---|---|---|
| 4,824,546 | A | * | 4/1989 | Ohmi ...................... B67C 3/202 204/192.12 |
| 5,110,438 | A | * | 5/1992 | Ohmi ................ H01J 37/32082 156/345.44 |
| 2003/0010624 | A1 | | 1/2003 | Voutsas et al. |
| 2003/0173207 | A1 | | 9/2003 | Zhang et al. |
| 2008/0245657 | A1 | * | 10/2008 | Takasawa ............... C23C 14/10 204/192.12 |
| 2009/0200159 | A1 | * | 8/2009 | Suzuki ................ C23C 14/0057 204/192.13 |

OTHER PUBLICATIONS

Olivares et al. "Sputtered SiO2 as Low Acoustic Impedance Material for Bragg Mirror Fabrication in BAW Resonators", IEEE Transactions on Ultrasonics, Ferroelectrics, and Frequency Control, vol. 57, No. 1, Jan. 2010.*
Demis D John et al: "Fabrication and Demonstration of a Pure Silica-Core Waveguide Utilizing a Density-Based Index Contrast", Optical Society of America, 2011.
D Coada et al: "Different Properties of SiO 2 Nanostructures With Different Working Gases." Journal of Optoelectronics and Advanced Materials vol. 5, No. 3, Sep. 2003, p. 687-691.
Vinay Gupta et al: "Improved Temperature Stability of LiNbO 3 Surface Acoustic Wave Devices with Sputtered SiO2 Over-Layers," Department of Physics and Astrophysics, University of Delhi, Delhi, 110007, India, Published online Mar. 9, 2011.

* cited by examiner

*Primary Examiner* — Rodney McDonald
(74) *Attorney, Agent, or Firm* — Volentine & Whitt, PLLC

(57) ABSTRACT

According to the invention there is a method of depositing $SiO_2$ onto a substrate by pulsed DC reactive sputtering which uses a sputtering gas mixture consisting essentially of oxygen and krypton.

12 Claims, 5 Drawing Sheets

DEPOSITION OF SILICON DIOXIDE

BACKGROUND

This invention relates to methods and apparatus for depositing silicon dioxide onto a substrate, to substrates having silicon dioxide deposited thereon, and also to structures and devices incorporating same.

Sputtered silicon dioxide has been widely used as a dielectric insulator of electronic switching and sensing devices such as metal-insulator-metal and metal-insulator-semiconductor switching devices. Silicon dioxide is also very attractive in optical and acoustic applications such as SAW, BAW and TCSAW filters because of its low refractive index, high transparency, and positive TCF (temperature coefficient of frequency).

It is known to deposit silicon dioxide thin films by thermal oxidation, plasma enhanced chemical vapour deposition (PECVD), reactive RF sputtering, and pulsed DC sputtering. The technique used to deposit the thin film is generally selected so that the properties of the thin film are best suited to the intended end application. Sputter deposition has the distinct advantage of being a low temperature fabrication process. In addition, pulsed DC magnetron sputtering provides higher deposition rates, more repeatable performance, and improved film quality compared to complicated and expensive RF sputtering techniques. However, there are certain drawbacks associated with pulsed DC sputtering. Conventional pulsed DC reactive sputtering of silicon dioxide and PECVD of silicon dioxide result in films having a density of less than or equal to 2.30 $gcm^{-3}$. However, it would be very desirable to produce silicon dioxide films having a density of greater than 2.30 $gcm^{-3}$ because this gives rise to improved acoustic and electrical performance such as in TCSAW applications.

It is known that the density of reactively sputtered silicon dioxide films can be increased by applying a DC bias to the wafer that the film is reactively sputtered onto. However, the maximum silicon dioxide film density achievable with conventional Ar sputtering is limited to about 2.35 $gcm^{-3}$. In addition to a desire to provide high density silicon dioxide films, there is also an ongoing commercial impetus to provide improved throughput during fabrication.

SUMMARY

The present invention, in at least some of its embodiments, addresses one or more of the above described problems and desires.

According to a first aspect of the invention there is provided a method of depositing $SiO_2$ onto a substrate by pulsed DC reactive sputtering which uses a sputtering gas mixture consisting essentially of oxygen and krypton.

The ratio of krypton to oxygen, expressed as a ratio of the krypton flow rate in sccm to the oxygen flow rate in sccm, may be in the range 0.1-0.9, preferably in the range 0.2-0.8. Ranges corresponding to any combination of these ratio values are also within the scope of the invention. In some embodiments, RF power is applied to the substrate to produce a DC bias. This can produce improved $SiO_2$ density. The RF power applied to the substrate may be in the range 20-150 W, preferably 20-125 W.

The sputtering gas mixture may be present at a pressure in the range 1 mTorr to 20 mTorr (0.13 Pa to 2.67 Pa).

An advantage of the invention is that it can produce $SiO_2$ deposits having high densities. The method may be performed to deposit $SiO_2$ having a density of 2.35 $gcm^{-3}$ or greater, preferably 2.40 $gcm^{-3}$ or greater.

Generally, the $SiO_2$ is deposited as a film, such as a thin film.

Typically, the substrate is positioned on a substrate holder. During the deposition of $SiO_2$, the substrate holder may be at a temperature of less than 100° C., preferably less than 70° C. Routinely, the deposition can be performed with the substrate holder at a temperature of around 50° C.

In some embodiments, $SiO_2$ is deposited onto the substrate by pulsed DC magnetron reactive sputtering.

According to a second aspect of the invention there is provided pulsed DC reactive sputtering apparatus for depositing $SiO_2$ onto a substrate including:

a chamber or system of chambers containing a substrate holder and a target;

a source of oxygen;

a source of krypton;

a gas supply system for supplying oxygen and krypton to the chamber; and means for providing a pulsed DC power to cause Si to be sputtered from the target.

Typically, the target is pure silicon or silicon dioxide. The substrate may be a silicon substrate, typically in the form of a wafer.

The apparatus may be a pulsed DC magnetron reactive sputtering apparatus. In these embodiments, the apparatus may further include a magnetron.

According to a third aspect of the invention there is provided a substrate having a deposit of $SiO_2$ thereon, in which the $SiO_2$ is reactively sputtered $SiO_2$ deposited by the method of the first aspect of the invention. The $SiO_2$ may have a density of 2.35 $gcm^{-3}$ or greater, preferably 2.40 $gcm^{-3}$ or greater.

According to a fourth aspect of the invention there is provided a structure or device including a substrate of the third aspect of the invention. Advantageously, the invention provides a SAW, BAW or TCSAW filter including a substrate in accordance with the third aspect of the invention. Higher density $SiO_2$ films provided by the invention have particular utility in these applications, and in other optical and acoustic applications.

Whilst the invention has been described above, it extends to any inventive combination of the features set out above, or in the following description, drawings or claims.

BRIEF DESCRIPTION OF THE DRAWINGS

Embodiments of methods and apparatus in accordance with the invention will now be described with reference to the accompanying drawings, in which.

DETAILED DESCRIPTION OF EMBODIMENTS

Figure 1:
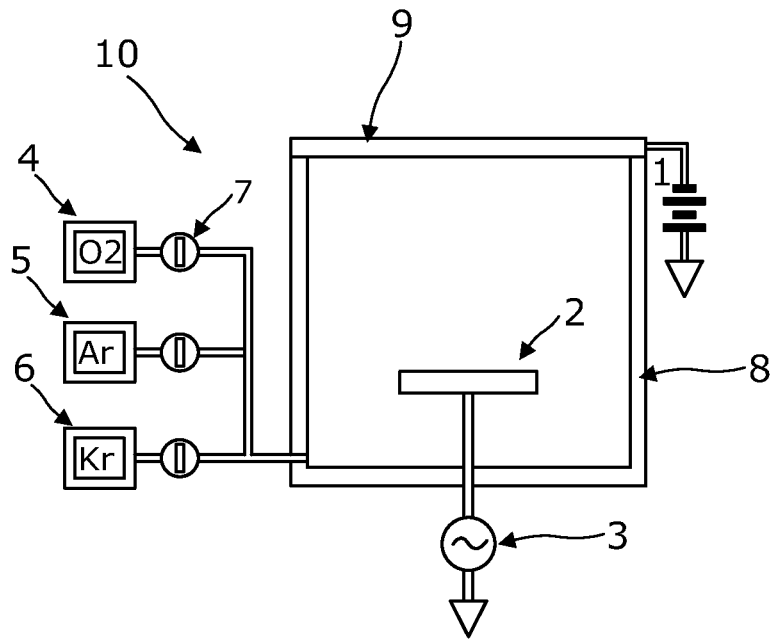
FIG. 1 is a semi-schematic diagram of apparatus of the invention.

FIG. 1 shows an embodiment of an apparatus of the invention, depicted generally at 10. The apparatus includes a vacuum chamber 8 within which is located a wafer platen 2. An upper portion of the chamber 8 includes the target 9, which can be formed from silicon or silicon dioxide. A pulsed DC power supply 1 is provided to apply pulsed DC power to the target 9. Typically, the apparatus will be in the form of a pulsed DC magnetron reactive sputtering arrangement, in which case the apparatus will further include a magnetron. This is not shown in FIG. 1, but in practice the magnetron would be located behind the target 9, as is well-known by the skilled reader. In use, the platen 2 supports substrate, typically a wafer, in opposition to the target 9. The platen 2 is formed from a conductive material which is biased with an RF signal provided by an RF power supply 3 through a capacitive coupling circuit so that the platen 2 can act as an electrode. The RF bias in the presence of a plasma produces a negative DC bias to develop on the platen 2 so that sputtered ions are accelerated towards the substrate. Sources of oxygen 4, argon 5 and krypton 6 are provided. Oxygen, argon or krypton are selectively admitted into the chamber 8 using mass flow controllers 7 as part of an appropriate gas manifold. Oxygen gas reacts with silicon sputtered from the target 9 to form a layer of silicon dioxide on the surface of a wafer positioned on the platen 2. It is understood that the argon source 5 is provided solely for the purpose of performing comparative experiments between reactive sputtering achieved using Ar/O$_2$ environments and reactive sputtering achieved using Kr/O$_2$ environments. In other embodiments an argon source 5 would not be provided and a simpler gas manifold might be used.

Figure 2:
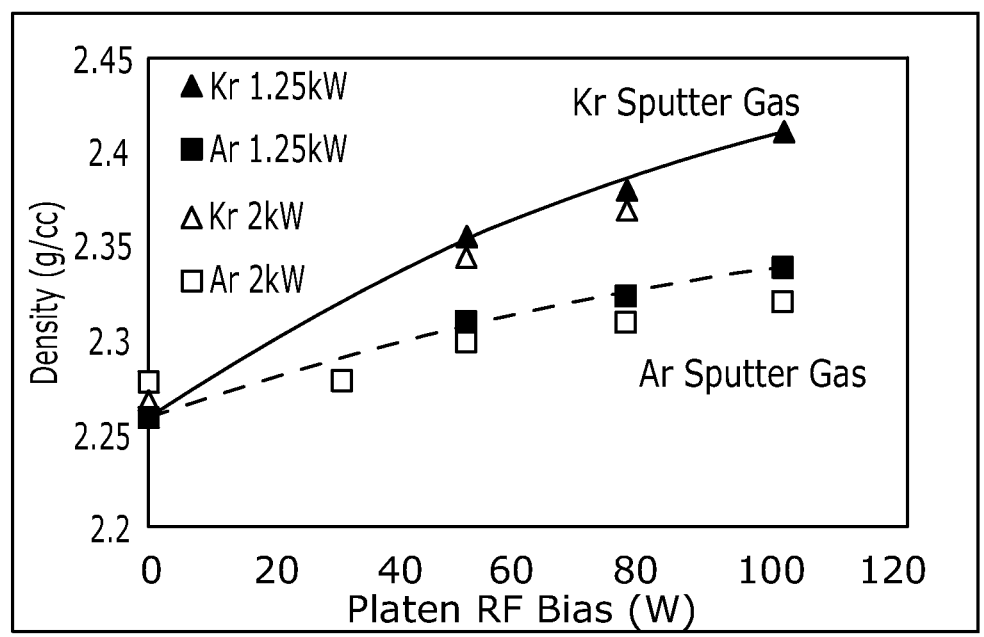
FIG. 2 shows $SiO_2$ film density versus platen RF for $SiO_2$ films deposited in $Ar/O_2$ and $Kr/O_2$ environments.

Experiments were performed using target powers of 1.25 and 2 kW, a platen temperature of 50° C., with various RF powers being applied to the platen 2. Experiments were performed in Ar/O$_2$ environments using flow rates of 30 sccm Ar and 80 sccm O$_2$. Experiments were also performed in Kr/O$_2$ environments using a Kr flow rate of 30 sccm, and an oxygen flow rate of 80 sccm. With an Ar/O$_2$ environment and a target power of 2 kW, the SiO$_2$ film density is 2.26 gcm$^{-3}$ at a film thickness of 1000 nm and no RF power applied to the platen. When RF power is applied to the platen, it is found that the film density increases, and at a platen RF power of 120 W, it is found that the film density increases by ~3% to 2.33 gcm$^{-3}$. It is believed that RF biasing of the platen helps to densify the silicon dioxide film by energetic ion bombardment. However, overly high DC bias (producing highly energetic ions) can also produce ion-irradiated defects and voids, actually resulting in a lower film density. This may explain why the SiO$_2$ film density appears to be saturating at the medium-high platen RF powers shown in FIG. 2 for deposition using Ar/O$_2$ environments. We have shown that with Ar/O$_2$ environments, the film density actually decreases at very high applied platen RF powers (data not shown here). FIG. 2 also shows SiO$_2$ film densities obtained using a Kr/O$_2$ reactive sputtering process. It can be seen that the use of a Kr/O$_2$ environment in the reactive sputtering process can result in the SiO$_2$ film density being increased to over 2.40 gcm$^{-3}$. We find that the film density is essentially independent of the target RF power, but increases with RF power applied to the platen.

Figure 3:
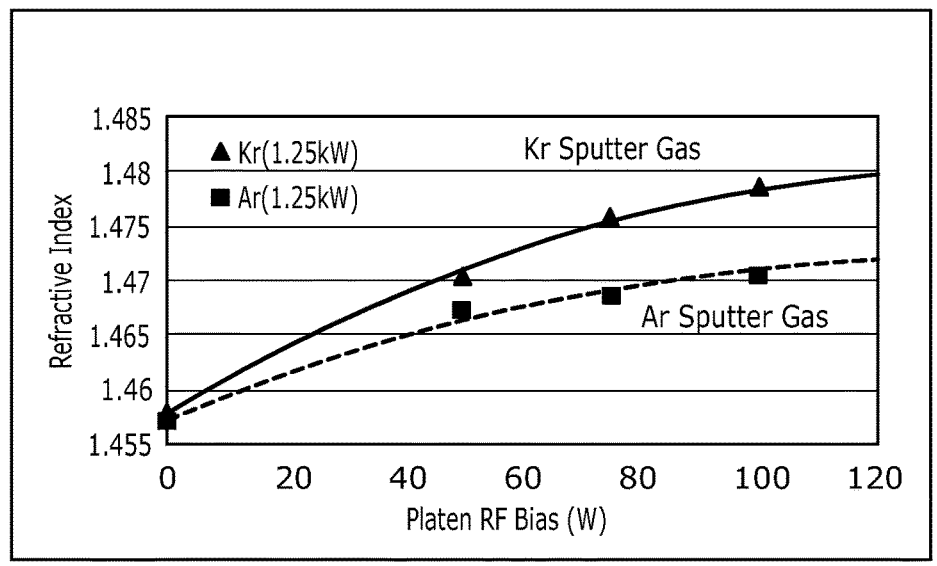
FIG. 3 shows $SiO_2$ refractive index versus platen RF for $SiO_2$ films deposited in $Ar/O_2$ and $Kr/O_2$ environments.

FIG. 3 shows that SiO$_2$ films reactively sputtered with Kr/O$_2$ have a higher refractive index than those reactively sputtered with Ar/O$_2$. This is consistent with the increased SiO$_2$ film density associated with Kr/O$_2$ reactive sputtering and may be indicative of a higher atomic packing density. In FIG. 3 for 1.5 kW pulsed DC power we can see a substantial increase in refractive index for higher bias powers.

Figure 4:
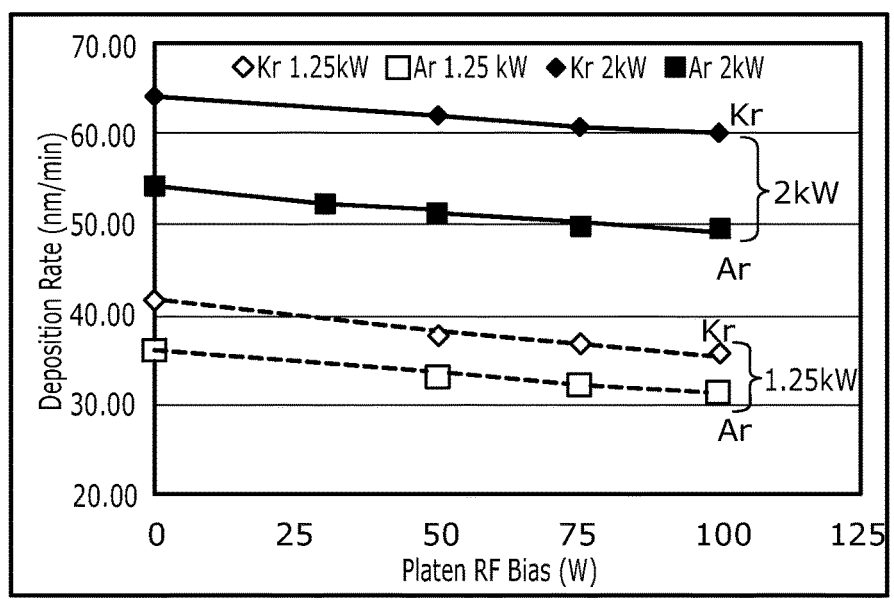
FIG. 4 shows $SiO_2$ deposition rate versus platen RF power for $Ar/O_2$ and $Kr/O_2$ environments.

FIG. 4 shows SiO$_2$ film deposition rate as a function of platen bias power for both Ar/O$_2$ and Kr/O$_2$ environments. Data were obtained for target RF powers of 2 kW and 1.25 kW. It can be seen that Kr/O$_2$ reactive sputtering provides a significant increase in deposition rate compared to Ar/O$_2$ reactive sputtering. More particularly, the deposition rate associated with the Kr/O$_2$ reactive sputtering process is ~16% higher than with the Ar/O$_2$ process, and this is essentially independent of the platen RF power. From this we conclude that the process of the present invention may have significant advantages in terms of fabrication throughput.

Without wishing to be constrained by any particular theory or conjecture, it is believed that the increase in deposition rate of silicon dioxide in the Kr/O$_2$ reactive sputter gas environment compared to Ar/O$_2$ can be partly attributed to the increased sputter yield of Kr in Si compared to Ar. However, the fact that film density is independent of deposition power tends to argue against simple momentum transfer as being the cause of the density increase for SiO$_2$ films reactively sputtered with Kr/O$_2$. In addition, the increases in deposition rate and film density are not accompanied by an increasing target voltage as shown in Table 1.

TABLE 1

Comparison of IV characteristics for different gas mixes, target RF power 2 kW

| Gas Mix | Target V (Volts) | Target I (Amps) | Pressure (mT) |
| --- | --- | --- | --- |
| 100% Ar | 386 | 5.1 | 8.3 |
| 100% Kr | 488 | 4.1 | 8.4 |
| 30 sccm Ar:80 sccm O$_2$ | 206 | 9.66 | 7.7 |
| 30 sccm Kr:80 sccm O$_2$ | 205 | 9.77 | 7.8 |

Figure 5:
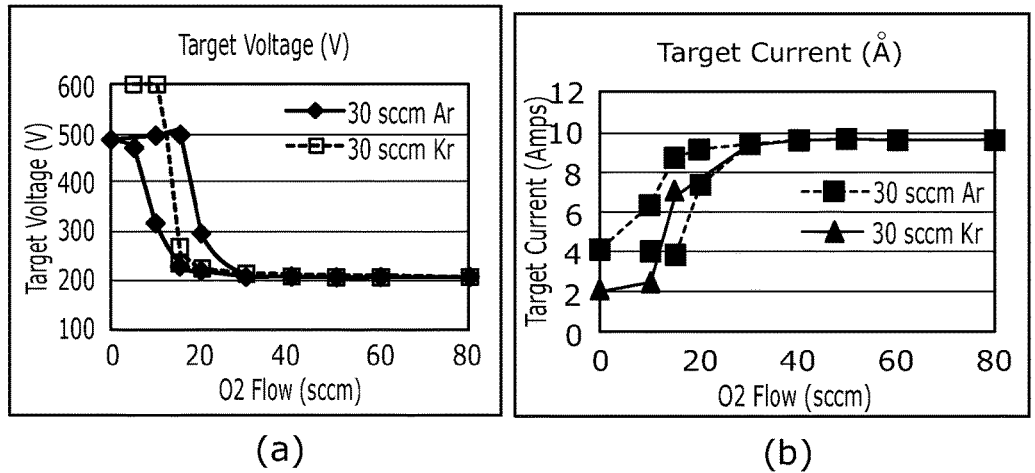
FIG. 5 shows hysteresis curves of (a) target voltage and (b) target current for a silicon target with Ar or Kr mixed with oxygen as a function of oxygen flow.

Although a krypton only plasma exhibits a much higher voltage and a lower current than an Ar only plasma at the same pressure, when sufficient oxygen is introduced to poison the target, the voltage and current for Ar/O$_2$ and Kr/O$_2$ plasmas are very similar. FIG. 5 shows IV characteristics for the reactive process with Ar and Kr. The target RF power is 2 kW. It can be seen that both the V and I characteristics of Ar/O$_2$ and Kr/O$_2$ converge as the O$_2$ fraction is increased and the target reaches the poisoned regime.

Figure 6:
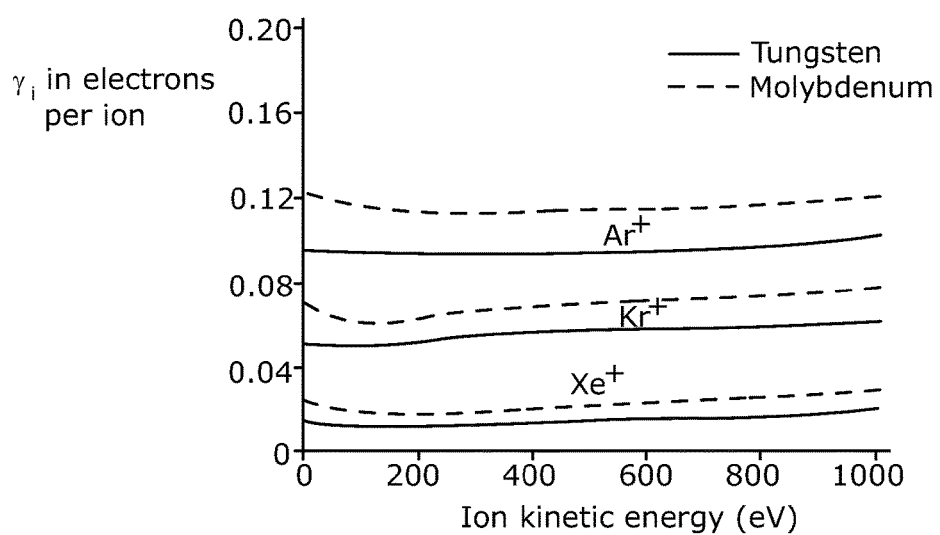
FIG. 6 shows secondary electron emission as a function of bombardment energy and gas type for ions incident on Mo and W targets (taken from Glow Discharge Processes, Chapman, Wiley and Sons, 1980)

A low current for the Kr only plasma is consistent with a low secondary electron emission for krypton compared with argon working gas. From the known data shown in FIG. 6, it can be seen that Ar has approximately twice the level of electron emission compared with Kr over a wide energy range. Therefore, sputtering with Kr instead of Ar will result in fewer secondary electrons being emitted from the target and a lower ionisation fraction. In addition, low energy secondary electrons emitted from the target can be captured by both inert ions (Ar and Kr) and the electronegative gas (oxygen) to form neutral recoil atoms and negative ions which can be accelerated away from the target. Both species can arrive at the substrate with appreciable energy and be incorporated into the growing $SiO_2$ film. Hence, it is believed that secondary electron emission has an important influence on $SiO_2$ film properties. Sputtering with krypton produces fewer reflected neutral recoil atoms than sputtering with argon. This can be expected to lead to an increase in film density for $SiO_2$ film sputtered using argon and not oxygen, due to a reduction in the number of inert gas atoms incorporated during film growth. Secondary electron emission is not strongly dependent on momentum transfer of ions to the target, which is consistent with the observation that silicon dioxide film density is not strongly dependent on target power.

Figure 7:
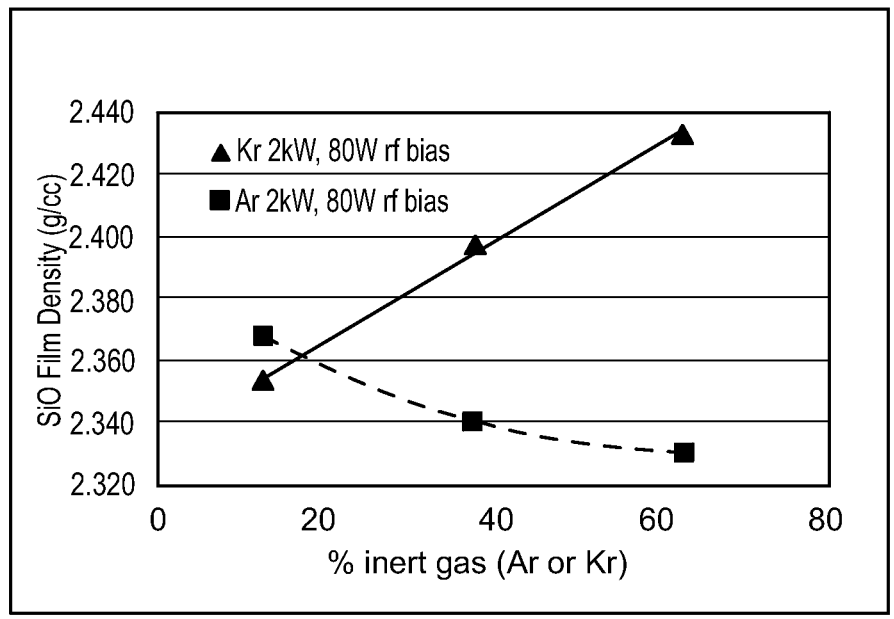
FIG. 7 shows SiO$_2$ film density versus percentage inert gas for SiO$_2$ films deposited in Ar/O$_2$ and Kr/O$_2$ environments.

FIG. 7 shows the relationship between silicon dioxide film density and the ratio of inert gas flow rate to oxygen flow rate (in sccm) for krypton and argon with 2 kW pulsed DC to the target and with a 80 W RF bias to the wafer. It can be seen that reactive sputtering with $Ar/O_2$ exhibits a reduction in film density as the argon fraction is increased. This is consistent with increased argon being trapped in the growing $SiO_2$ film. However, $SiO_2$ film sputtered with $Kr/O_2$ show an increase in film density as the Kr fraction is increased.

Figure 8:
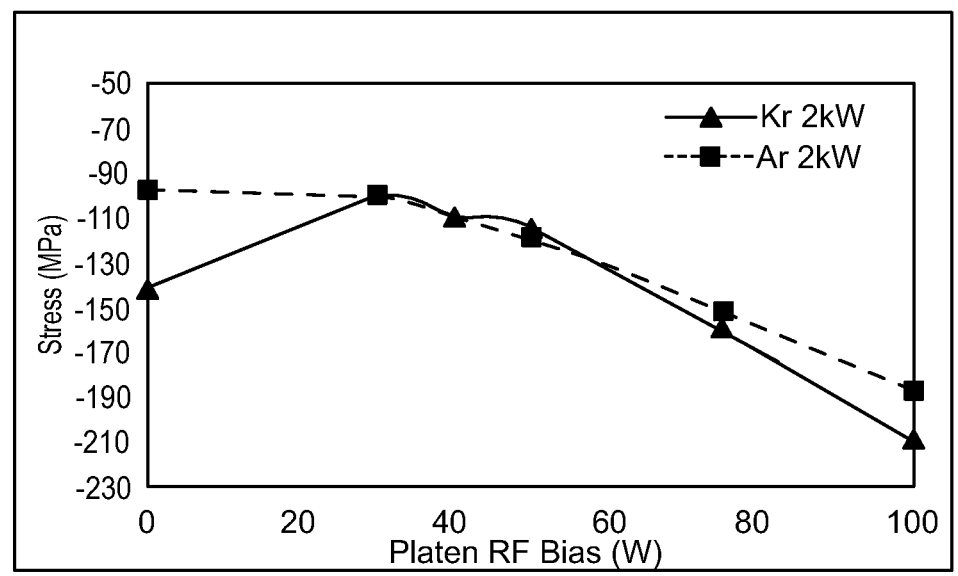
FIG. 8 shows SiO$_2$ film stress versus platen RF power for SiO$_2$ films deposited in Ar/O$_2$ and Kr/O$_2$ environments.

FIG. 8 shows $SiO_2$ film stress as a function of platen RF power for $SiO_2$ films were actually sputtered using Kr/oxygen and Ar/oxygen. A target RF power of 2 kW was used. The $SiO_2$ film stress does become increasingly compressive in nature with increased platen RF bias, but there is not a direct correlation between $SiO_2$ film stress and film density. $SiO_2$ films reactively sputtered using krypton are more compressive with no platen RF bias compared to $SiO_2$ films sputtered using argon at zero platen RF bias. However, there is little difference in stress between $Ar/O_2$ reactively sputtered films and the higher density films associated with $Kr/O_2$ reactive sputtering at the same platen RF powers. Most authors conclude that compressive stress is the result of film bombardment by energetic particles. Inert gas entrapment in sputtered films is often observed, even with ion bombardment, but it is not necessarily causative of stress generation. Indeed, it had been demonstrated in the literature that stress and neutral gas incorporation are independent quantities. Without wishing to be bound by any particular theory or conjecture, we note that the different dependence of silicon dioxide film stress and density on applied RF power to the platen tends to point to neutral gas entrapment playing a significant role in $SiO_2$ film density.

Figure 9:
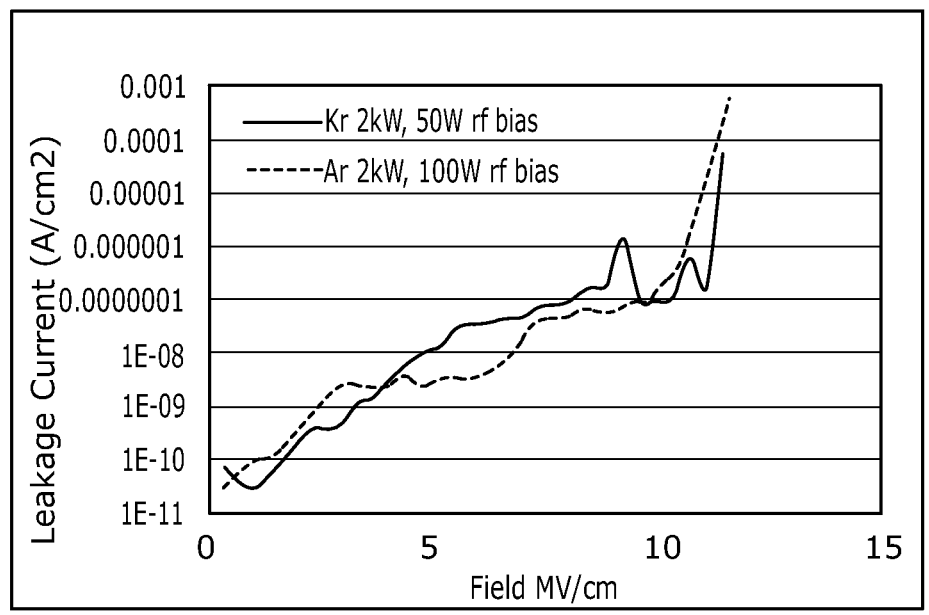
FIG. 9 shows electrical breakdown data (current density versus field) for silicon dioxide films sputtered in Ar/O$_2$ and Kr/O$_2$ environments.
Figure 10:
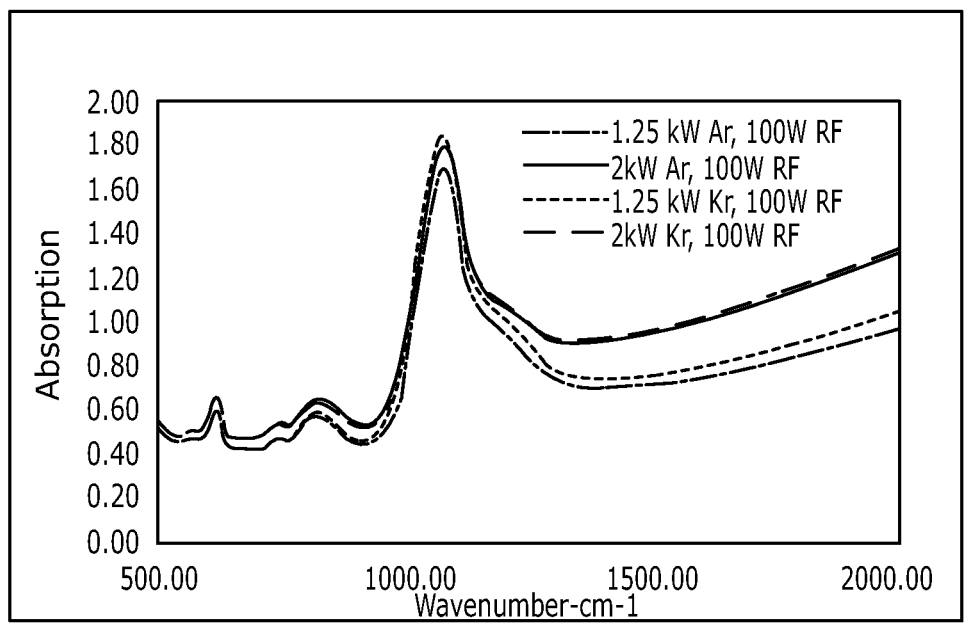
FIG. 10 shows FTIR spectra for SiO$_2$ films sputtered in Ar/O$_2$ and Kr/O$_2$ environments.

The properties and quality of the deposited silicon dioxide film have been investigated. FIG. 9 shows electrical breakdown behaviour for $SiO_2$ films of similar density (ca. 2.35 $gcm^{-3}$) sputtered with argon and krypton. Comparable electrical breakdown behaviour is observed for films of similar density. FIG. 10 shows FTIR absorption spectra of $SiO_2$ films deposited with $Kr/O_2$ and $Ar/O_2$. The absorption spectra of the deposited films show peak intensities due to Si—O—Si stretching and bending modes at 1090 $cm^{-1}$ and 812 $cm^{-1}$ respectively. The position and the shape of the main Si—O vibrational band at 1085 $cm^{-1}$ is consistent with the behaviour of a pure stoichiometric silicon dioxide film. There is no significant difference in the spectra obtained for the $Ar/O_2$ and $Kr/O_2$ reactively sputtered films, indicating that they are structurally similar. The data shown in FIGS. 9 and 10 indicate that $SiO_2$ films deposited using $Kr/O_2$ reactive sputtering of the invention are of high quality and have good performance characteristics.

The $Kr/O_2$ based reactive sputtering of $SiO_2$ provided by the present invention has been demonstrated to produce films showing good electrical breakdown performance and comparable wet etch rates to films obtained using prior art $Ar/O_2$ reactive sputtering techniques. The present invention can produce $SiO_2$ films having higher densities than the films produced using prior art techniques, but otherwise appear to be structurally indistinguishable from the prior art films. Additionally, significant improvements in film deposition rate can be achieved, with improvements of up to 20% being observed. Improvements are observed over a wide range of process conditions. The skilled reader will be able to optimise the reactive sputtering technique of the invention to suit any given end application or to satisfy desired fabrication criteria by routine experimentation. For example, an RF bias may be applied to the substrate holder in order to achieve an acceptable trade off between film density and deposition rate.

$SiO_2$ films produced in accordance with the invention have a wide range of possible end applications. The improved properties associated with the invention make the $SiO_2$ films particularly attractive for optical and acoustic end applications such as with SAW, BAW and TCSAW filters.

What is claimed is:

1. A method of depositing $SiO_2$ onto a substrate, comprising:
   supporting the substrate with an electrically conductive platen within a chamber of sputtering apparatus;
   providing a sputtering gas mixture consisting essentially of oxygen and krypton in the chamber of the sputtering apparatus by introducing the oxygen and krypton into the chamber at respective flow rates, wherein the ratio of the flow rate of the krypton in units of sccm to the flow rate of the oxygen in units of sccm is in the range of 0.1 to 0.9;
   providing a pulsed DC power to a target of the sputtering apparatus; and
   applying RF power to the platen to produce a DC bias;
   wherein the target comprises silicon, silicon is sputtered from the target by the sputtering gas mixture consisting essentially of krypton and oxygen, sputtered ions are accelerated to the substrate on the platen by the DC bias, and $SiO_2$ is deposited on the substrate as a result.

2. A method according to claim 1 in which said ratio of the flow rates of krypton to oxygen is in the range 0.2 to 0.8.

3. A method according to claim 1 in which the RF power applied to the substrate is in the range 20 to 150 W.

4. A method according to claim 1 in which the sputtering gas mixture is present in the process chamber, in which the deposition of $SiO_2$ takes place, at a pressure in the range 1 mTorr to 20 mTorr (0.13 Pa to 2.67 Pa).

5. A method according to claim 1 which deposits the $SiO_2$ so as to have a density of 2.35 $gcm^{-3}$ or greater on the substrate.

6. A method according to claim 1 in which the $SiO_2$ is deposited as a film.

7. A method according to claim 1 in which the substrate is positioned on a substrate holder, and during the deposition of $SiO_2$ the substrate holder is at a temperature of less than 100° C.

8. A method according to claim 1 in which the pulsed DC power is provided by a magnetron.

9. A method according to claim 1 in which the RF power applied to the substrate is in the range 20 to 125 W.

10. A method according to claim 1 which deposits the $SiO_2$ so as to have a density on the substrate of 2.40 gcm$^{-3}$ or greater.

11. A method according to claim 1 in which the substrate is positioned on a substrate holder, and during the deposition of $SiO_2$ the substrate holder is at a temperature of less than 70° C.

12. A method of depositing $SiO_2$ onto a substrate, comprising:
  supporting the substrate with an electrically conductive platen within a chamber of sputtering apparatus;
  introducing a sputtering gas mixture consisting essentially of oxygen and krypton into the chamber of the sputtering apparatus, wherein the percentage of the krypton in the sputtering gas mixture is at least 30%;
  providing a pulsed DC power to a target of the apparatus; and
  applying RF power to the platen to produce a DC bias, wherein the target comprises silicon, and
  silicon is sputtered from the target by the sputtering gas mixture, sputtered ions are accelerated to the substrate on the platen by the DC bias, and $SiO_2$ is thereby deposited on the substrate so as to have a density on the substrate of at least 2.35 gcm$^{-3}$ as a result.

* * * * *